US006995084B2

(12) United States Patent
Srivastava et al.

(10) Patent No.: US 6,995,084 B2
(45) Date of Patent: Feb. 7, 2006

(54) METHOD FOR FORMING ROBUST SOLDER INTERCONNECT STRUCTURES BY REDUCING EFFECTS OF SEED LAYER UNDERETCHING

(75) Inventors: Kamalesh K. Srivastava, Wappingers Falls, NY (US); Subhash L. Shinde, Courtlandt Manor, NY (US); Tien-Jen Cheng, Bedford, NY (US); Sarah H. Knickerbocker, Hopewell Junction, NY (US); Roger A. Quon, Rhinebeck, NY (US); William E. Sablinski, Beacon, NY (US); Julie C. Biggs, Wappingers Falls, NY (US); David E. Eichstadt, Park Ridge, IL (US); Jonathan H. Griffith, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/708,649

(22) Filed: Mar. 17, 2004

(65) Prior Publication Data

US 2005/0208748 A1 Sep. 22, 2005

(51) Int. Cl.
*H01L 21/44* (2006.01)
(52) U.S. Cl. .................... 438/613; 438/614
(58) Field of Classification Search ............ 257/738, 257/737; 438/613, 614
See application file for complete search history.

(56) References Cited

U.S. PATENT DOCUMENTS

| 5,462,638 A | 10/1995 | Datta et al. .............. 438/695 |
| 5,486,282 A | 1/1996 | Datta et al. .............. 205/123 |
| 5,620,611 A | 4/1997 | Datta et al. .............. 216/108 |
| 5,796,168 A | 8/1998 | Datta et al. .............. 257/762 |
| 5,937,320 A * | 8/1999 | Andricacos et al. ........ 438/614 |
| 6,293,457 B1 | 9/2001 | Srivastava et al. .......... 228/254 |
| 6,468,413 B1 | 10/2002 | Fanti et al. .............. 205/682 |
| 6,492,197 B1 * | 12/2002 | Rinne .................... 438/108 |
| 6,613,663 B2 * | 9/2003 | Furuya ................... 438/613 |

\* cited by examiner

*Primary Examiner*—Phat X. Cao
(74) *Attorney, Agent, or Firm*—James Cioffi; Cantor Colburn LLP

(57) ABSTRACT

A method for forming an interconnect structure for a semiconductor device includes defining a via in a passivation layer so as expose a top metal layer in the semiconductor device. A seed layer is formed over the passivation layer, sidewalls of the via, and the top metal layer. A barrier layer is formed over an exposed portion of the seed layer, the exposed portion defined by a first patterned opening. The semiconductor device is annealed so as to cause atoms from the barrier layer to diffuse into the seed layer thereunderneath, wherein the annealing causes diffused regions of the seed layer to have an altered electrical resistivity and electrode potential with respect to undiffused regions of the seed layer.

12 Claims, 14 Drawing Sheets

METHOD FOR FORMING ROBUST SOLDER INTERCONNECT STRUCTURES BY REDUCING EFFECTS OF SEED LAYER UNDERETCHING

BACKGROUND OF INVENTION

The present invention relates generally to semiconductor device processing and, more particularly, to a method for forming robust solder interconnect structures by reducing effects of seed layer underetching with respect to a barrier layer.

In the manufacture of semiconductor devices, C4 (Controlled-Collapse Chip Connection) is a means of connecting integrated circuit chips to substrates in electronic packages. In particular, C4 is a flip-chip technology in which the interconnections are small solder balls (or bumps) formed on the chip surface. The top layers of an integrated circuit chip include various wiring levels, separated by insulating layers of dielectric material, that provide input/output for the device. In C4 structures, the chip wiring is terminated by a plurality of metal films that form the ball-limiting metallurgy (BLM). The BLM defines the size of the solder bump after reflow, and provides a surface that is wettable by the solder and that reacts with the solder material to provide good adhesion and acceptable reliability under mechanical and thermal stress. In addition, the BLM also serves as a diffusion barrier between the integrated circuit device and the metals in the interconnection.

As is known in the art, the BLM includes a continuous stack of metal films across formed over the wafer to be bumped. This stack of films, also known as a "seed layer" performs a dual function. First, the seed layer provides a conductive path for current flow during subsequent electrolytic deposition of the solder bumps. Second, portion of the original seed layer remains under the solder bumps and forms the basis for the BLM of the C4s. Accordingly, the seed layer must include at least one layer that is conductive enough to permit uniform electrodeposition across the entire expanse of the wafer. Moreover, the bottom layer must adhere well to the underlying semiconductor device passivation, while the top layer must interact sufficiently with the solder to form a reliable bond.

While different seed layer metallurgies are available in C4 fabrication, one common combination includes a sputtered titanium-tungsten (TiW) adhesion layer, followed by phased or codeposited chromium-copper (CrCu) and copper (Cu) layers. Once the seed layer is formed over the via-patterned passivation layer, another photolithographic patterning process is implemented for forming the solder material within the mask holes in which the C4 bumps are to be defined. In order to reduce the effects of dissolution of copper within the solder material after an extended number of reflow operations, a thin nickel/copper (Ni/Cu) layer is also commonly used in the BLM as a barrier therebetween. The Ni/Cu barrier layer is electroplated onto the portions of the seed layer left exposed following the C4 patterning step.

After the nickel/copper and solder bump materials are plated, the developed resist is removed and the remaining seed layer is removed by etching. More specifically, the Cu and CrCu layers are removed by electroetching, while the TiW layer is removed by a wet chemical etch process. Unfortunately, during the electroetching process, there is an undercut of the Cu and CrCu portions of the seed layer with respect to the Ni/Cu barrier layer. This results in an incomplete BLM in terms of the layers (TiW/CrCu/Cu/Ni) defined under the solder bump. In certain instances, about 30 to 40% of the outer edge of C4 base is left with an inadequate BLM stack. These defects are problematic in terms of the integrity of C4 joint reliability.

Accordingly, it would be desirable to implement a process of forming a BLM for C4 solder bump interconnects in a manner that does not result in a substantial underetch of the seed layer with respect to the barrier layer so as to adversely impact C4 structural integrity.

SUMMARY OF INVENTION

The foregoing discussed drawbacks and deficiencies of the prior art are overcome or alleviated by a method for an interconnect structure for a semiconductor device. In an exemplary embodiment, the method includes defining a via in a passivation layer so as expose a top metal layer in the semiconductor device. A seed layer is formed over the passivation layer, sidewalls of the via, and the top metal layer. A barrier layer is formed over an exposed portion of the seed layer, the exposed portion defined by a first patterned opening of a first diameter, and a solder material is formed over the barrier layer using a second patterned opening of a second diameter. The second patterned opening is configured such that the second diameter is larger than the first diameter.

In another embodiment, a method for forming an interconnect structure for a semiconductor device includes defining a via in a passivation layer so as expose a top metal layer in the semiconductor device. A seed layer is formed over the passivation layer, sidewalls of the via, and the top metal layer. A barrier layer is formed over an exposed portion of the seed layer, the exposed portion defined by a first patterned opening. The semiconductor device is annealed so as to cause atoms from the barrier layer to diffuse into the seed layer thereunderneath, wherein the annealing causes diffused regions of the seed layer to have an altered electrical resistivity and electrode potential with respect to undiffused regions of the seed layer.

In still another embodiment, a method for introducing a self etch stop mechanism within a metallic thin film includes forming an overlayer upon the thin film, and annealing the thin film so as to cause atoms from the overlayer to diffuse into the thin film thereunderneath. The annealing causes diffused regions of the thin film to have an altered electrical resistivity and electrode potential with respect to undiffused regions of the thin film.

BRIEF DESCRIPTION OF DRAWINGS

Referring to the exemplary drawings wherein like elements are numbered alike in the several Figures.

DETAILED DESCRIPTION

Disclosed herein is a method for forming robust solder interconnect structures by reducing effects of seed layer underetching with respect to a barrier layer. In one embodiment, an additional photolithography patterning step is used to separately define the areas in which the solder bump material is deposited, with respect to the patterning step used to define the areas for plating the barrier layer. The second patterning preferably results in a C4 pattern that is wider than the barrier layer pattern. In this manner, the subsequent etch of the seed layer results in an undercutting of the wider solder portions, and not the barrier layer itself. The wettablilty of the copper seed surface relative to the solder material results in a retraction of the solder to a truncated spherical shape upon reflow, with a complete BLM stack thereunderneath.

In another embodiment, the electrical resistivity and electrode potential of the Cu portion of the seed layer is altered by an annealing step wherein the Ni atoms from the barrier layer are diffused into the copper. This in turn modifies the electroetch characteristics of the seed layer, effectively introducing an etch stop into the seed layer. As is discussed hereinafter, the annealing embodiment may be implemented in conjunction with a pair of photoresist exposure steps using existing photoresist materials, or may be implemented in a single lithography exposure step using photoresist material(s) that can withstand an annealing step. In addition, the diffusion annealing approach may also be used in combination with the separate, "wider" C4 patterning approach.

Figure 1A:
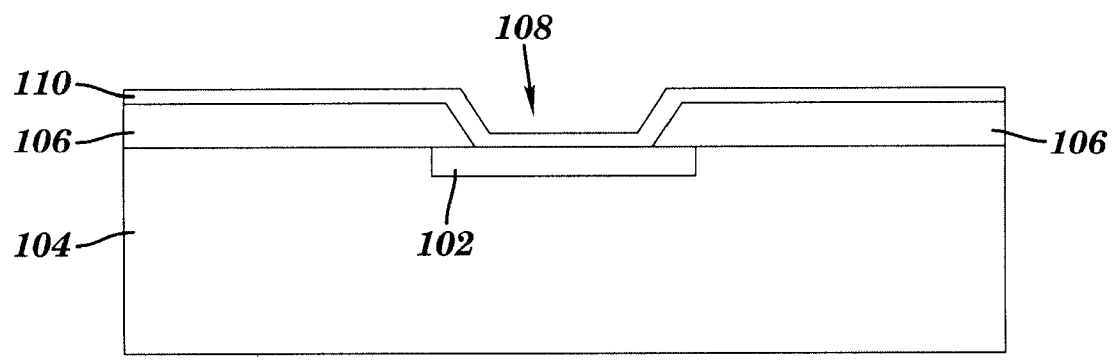
FIGS. 1(a) through 1(d) illustrate cross-sectional views of an existing process for forming BLM structures for C4 solder interconnects.

Referring initially to FIGS. 1(a) through 1(d), there is shown a series of cross-sectional views of an existing process for forming BLM structures 100 for C4 solder interconnects. In FIG. 1(a), The structure 100 features a metal bond pad 102 (e.g., copper, aluminum) formed at an uppermost metallization level of a semiconductor substrate 104, and which serves to provide an external connection to the active devices (not shown) formed in the substrate 104 through various levels of interconnect structures therebetween. A final passivation layer 106 includes alternating layers of dielectric material (e.g., $SiO_2$ or low-k material) and pad nitride material (e.g., $Si_3N_4$), followed by a photosensitive polyimide (PSPI) layer. For purposes of illustration, the multilayer passivation layer 106 is depicted as a single layer in the Figures.

Figure 1B:
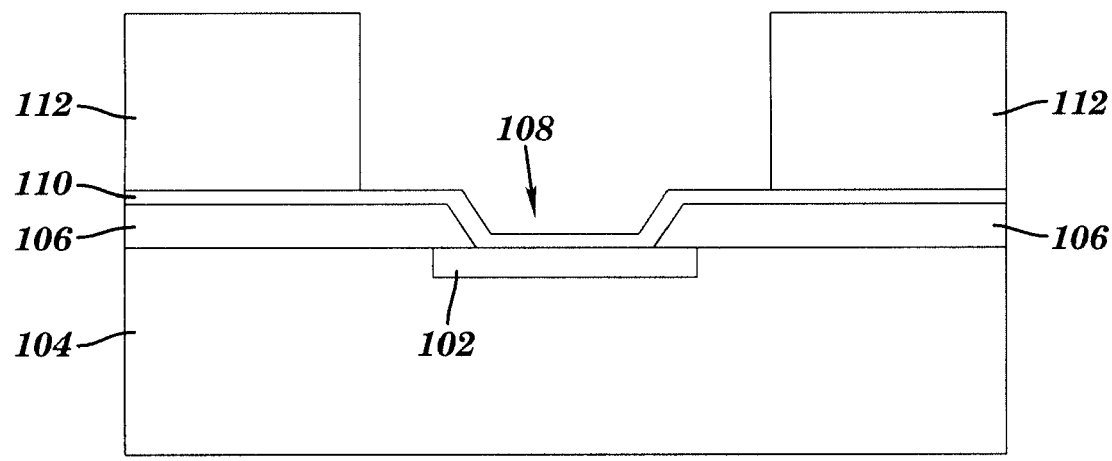
Figure 1C:
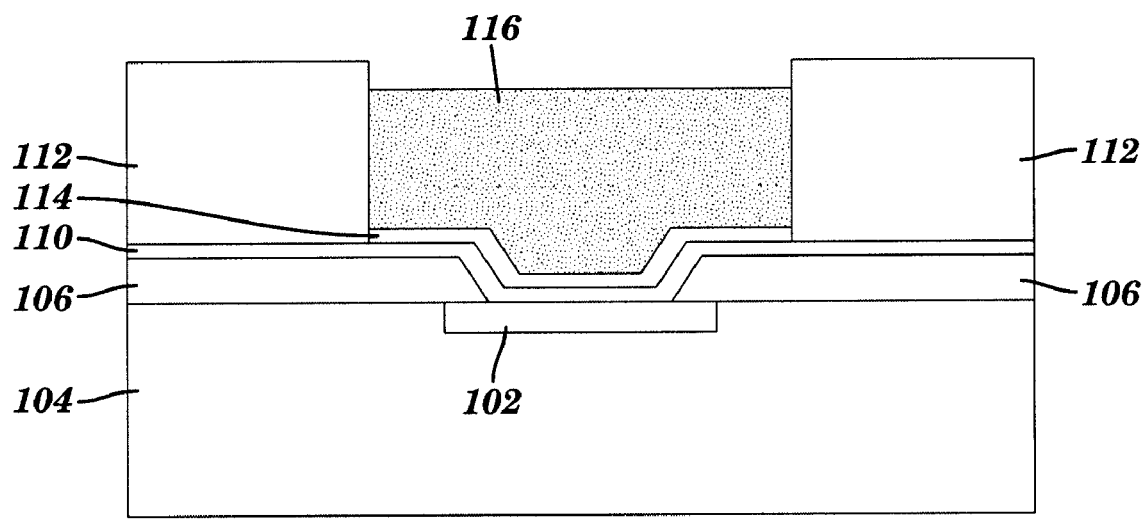

In order to provide access for a suitable external connection a via or opening 108 is formed through the passivation layer 106 to the top surface of the metal pad 102. As discussed previously, a seed layer 110 (including layers of TiW/CrCu/Cu) is deposited (e.g., by sputtering) over the entire structure, including the sidewalls of the via 108 and the top of the metal pad 102. As shown in FIG. 1(b), a patterned and developed layer of photoresist material 112 is used to define the locations in which the C4 connections are to be formed. In FIG. 1(c), both a barrier layer (e.g., nickel, nickel/copper) 114 and the solder material 116 are deposited using the same pattern of photoresist material 112. The solder material 116 may be, for example, a Pb rich Pb—Sn solder, a Pb—Sn eutectic, or a Pb-free (e.g., Sn rich) solder.

Figure 1D:
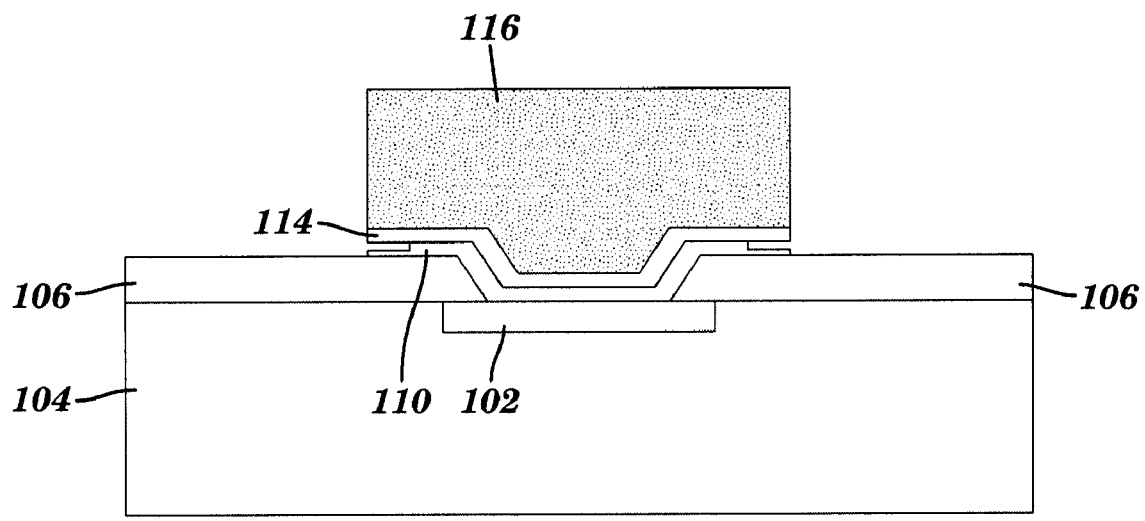

Next the photoresist 112 is removed and the seed layer 110 is etched back, with the CrCu/Cu portions of the seed layer 110 being removed by electroetching and the TiW portion being removed by wet chemical etching. As a result of the electroetching, there is an undercut of the CrCu/Cu portions of the seed layer 110 with respect to the barrier layer 114. Therefore, the overall size of the resulting BLM is smaller than the base of the solder material, as shown in FIG. 1(d).

Figure 2:
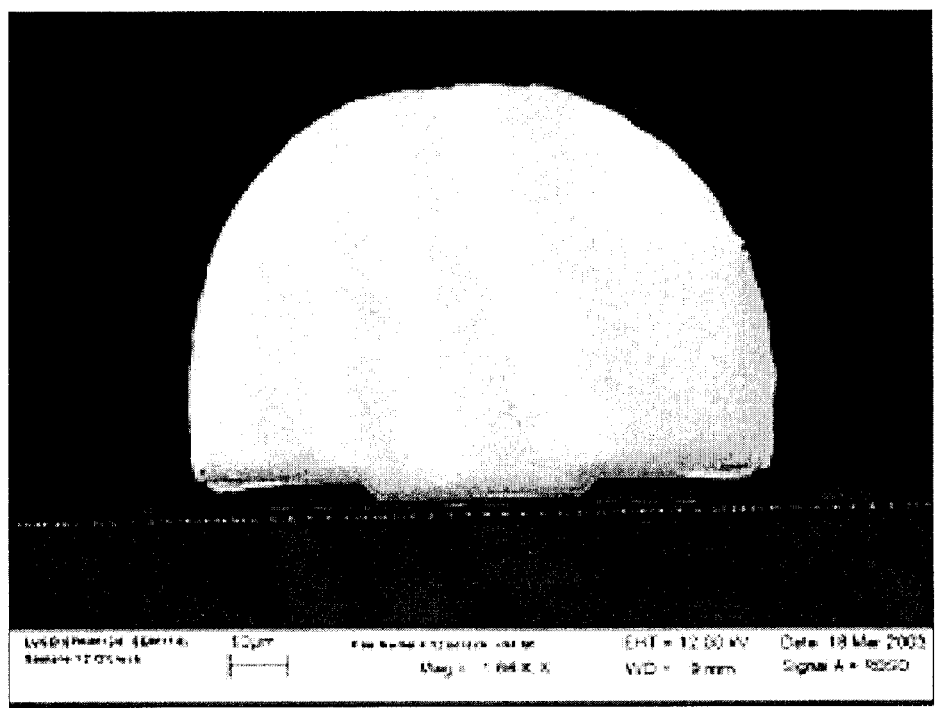
FIGS. 2–5 are SEM cross sections of an exemplary C4 bump and BLM structure formed in the depicted in FIGS. 1(a) through 1(d)
Figure 3:
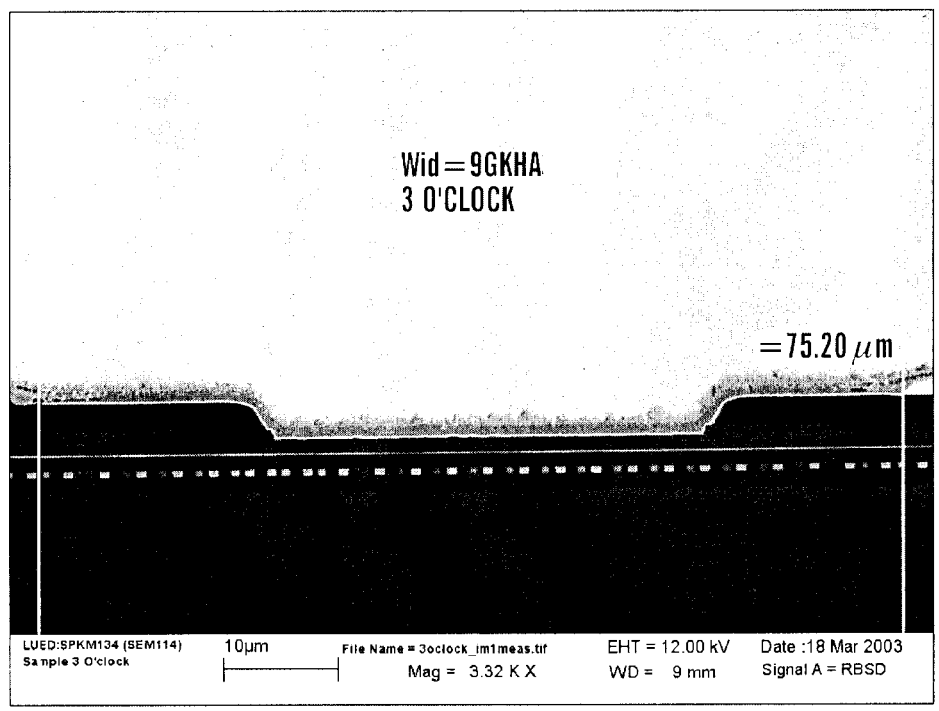
Figure 4:
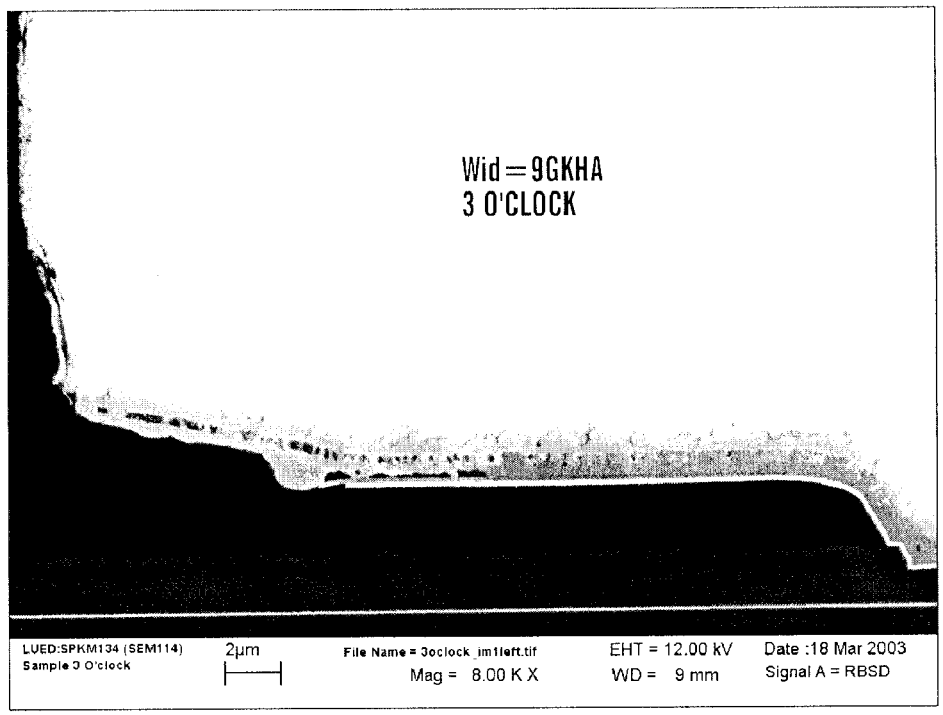
Figure 5:
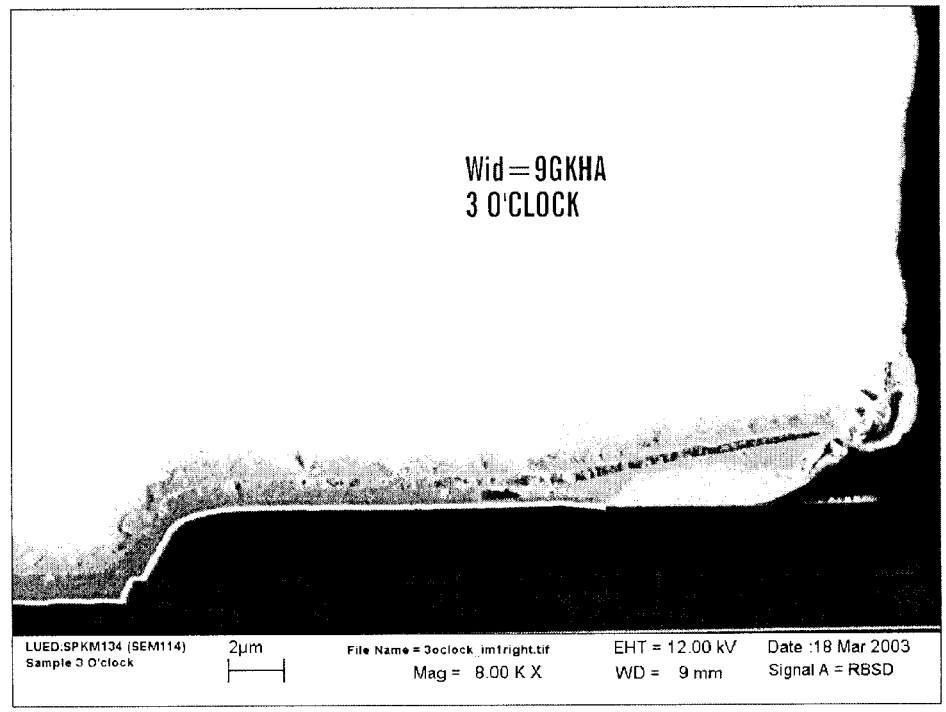

FIGS. 2–5 are SEM photographs of a C4 bump and BLM structure, formed in the conventional manner described above, with an undercutting of the seed layer 110. FIG. 2 shows the C4 structure as a whole, while FIGS. 3, 4 and 5 respectively illustrate the middle, left and right portions of the C4 and BLM in greater detail.

Figure 6A:
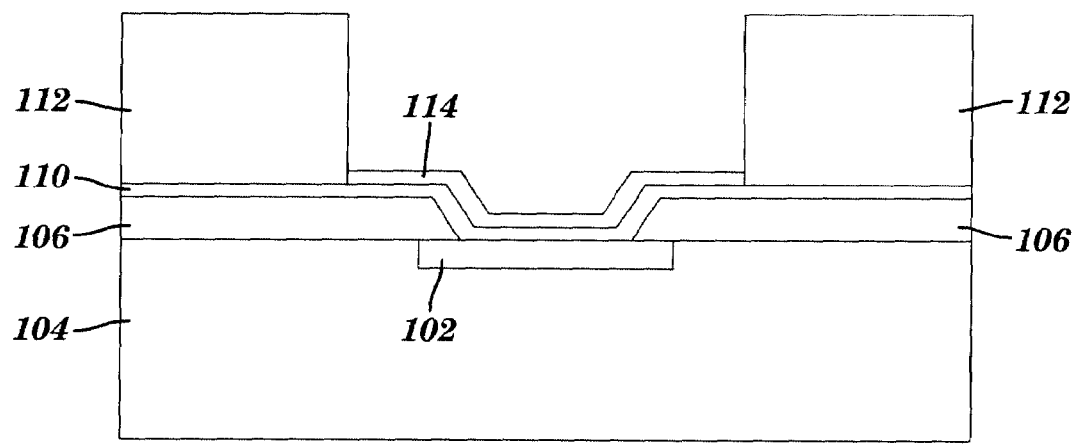
FIGS. 6(a) through 6(e) illustrate cross-sectional views of a method for forming robust solder interconnect structures by reducing effects of seed layer underetching with respect to a barrier layer, in accordance with an embodiment of the invention.

Referring now to FIGS. 6(a) through 6(e) there is shown, in accordance with an embodiment of the invention, a method for forming robust solder interconnect structures by reducing effects of seed layer underetching with respect to a barrier layer. In particular, FIG. 6(a) illustrates a point in the device processing just prior to the solder material deposition as was depicted in FIG. 1(c). That is, FIG. 6(a) shows a first photoresist patterning step used to form a barrier layer 114 over the blanket seed layer 110 so as to ultimately define the dimensions of the BLM and C4 solder ball structures. However, in contrast to the conventional processes, the photoresist layer 112 is stripped prior to the deposition of the solder material.

Figure 6B:
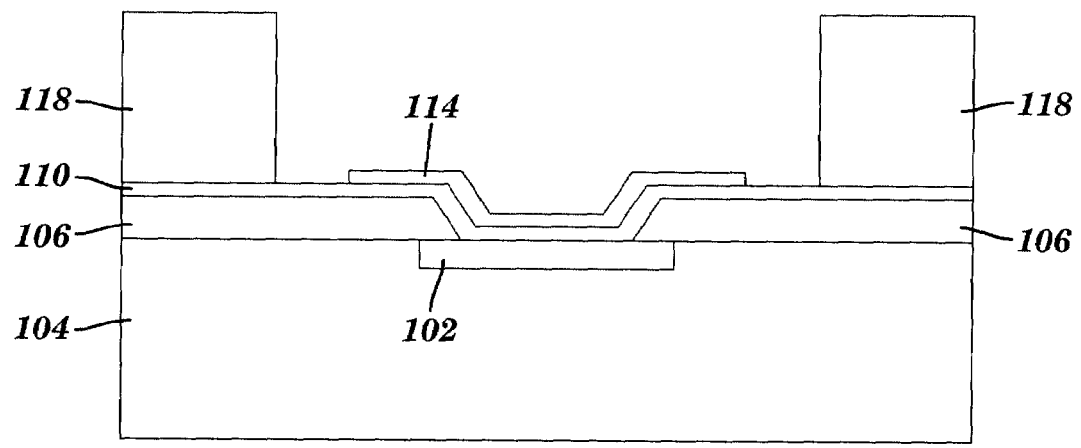
Figure 6C:
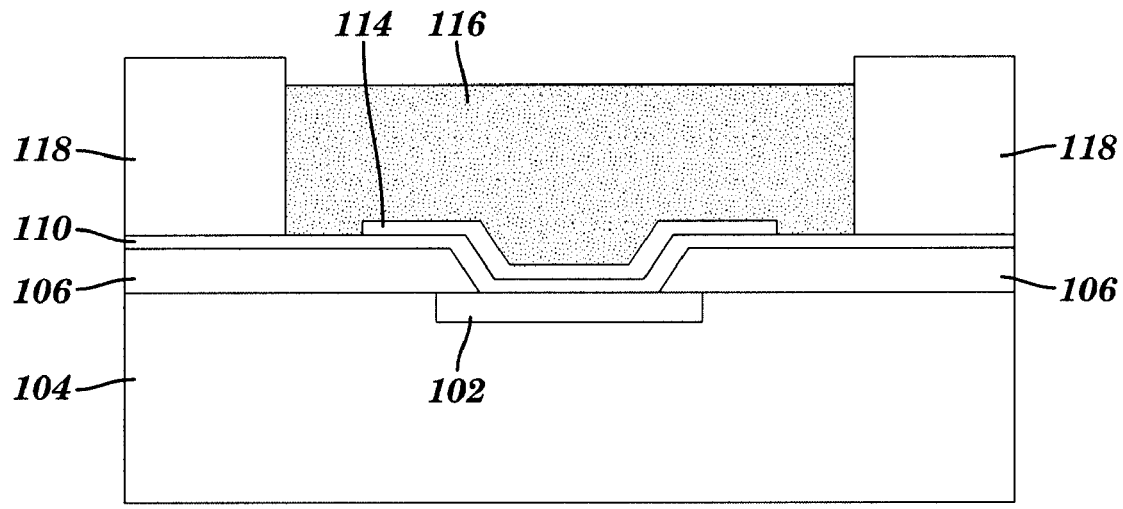

Then, as shown in FIG. 6(b), a second photoresist patterning step is used to define a separate C4 pattern, wherein the opening defined by a second patterned resist layer 118 is larger than that used to define the barrier layer pattern (i.e., the BLM pattern). Accordingly, when the solder material 116 is then deposited into the pattern created in photoresist layer 118, the solder material 116 extends over the outer edges of the barrier layer 116 and directly onto a portion of the seed layer 110, as shown in FIG. 6(c). In an exemplary embodiment, the opening defined by the second patterned resist layer 118 may be about 20 to about 25 microns larger than the opening defined by the first patterned resist layer 112.

Figure 6D:
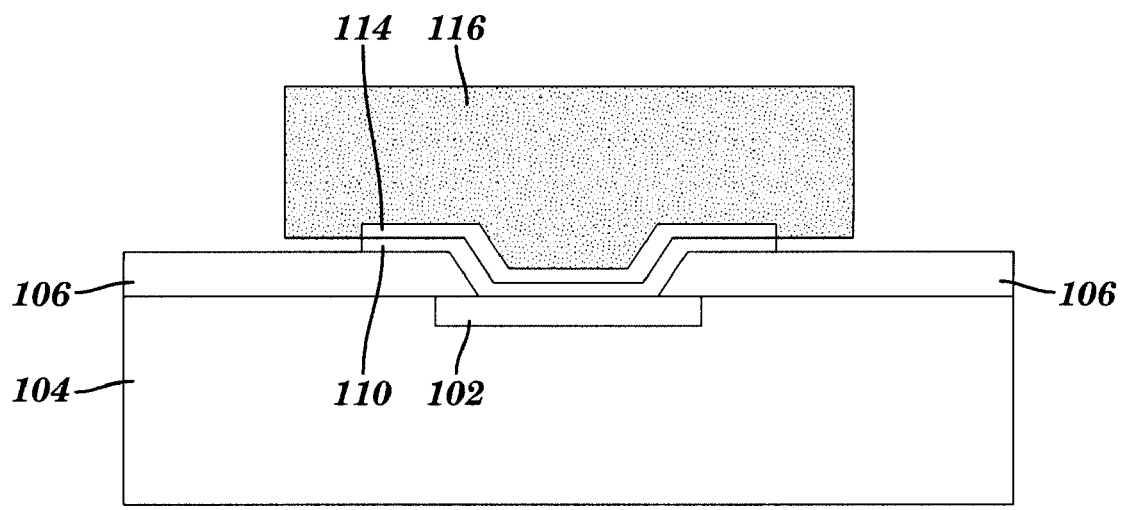
Figure 6E:
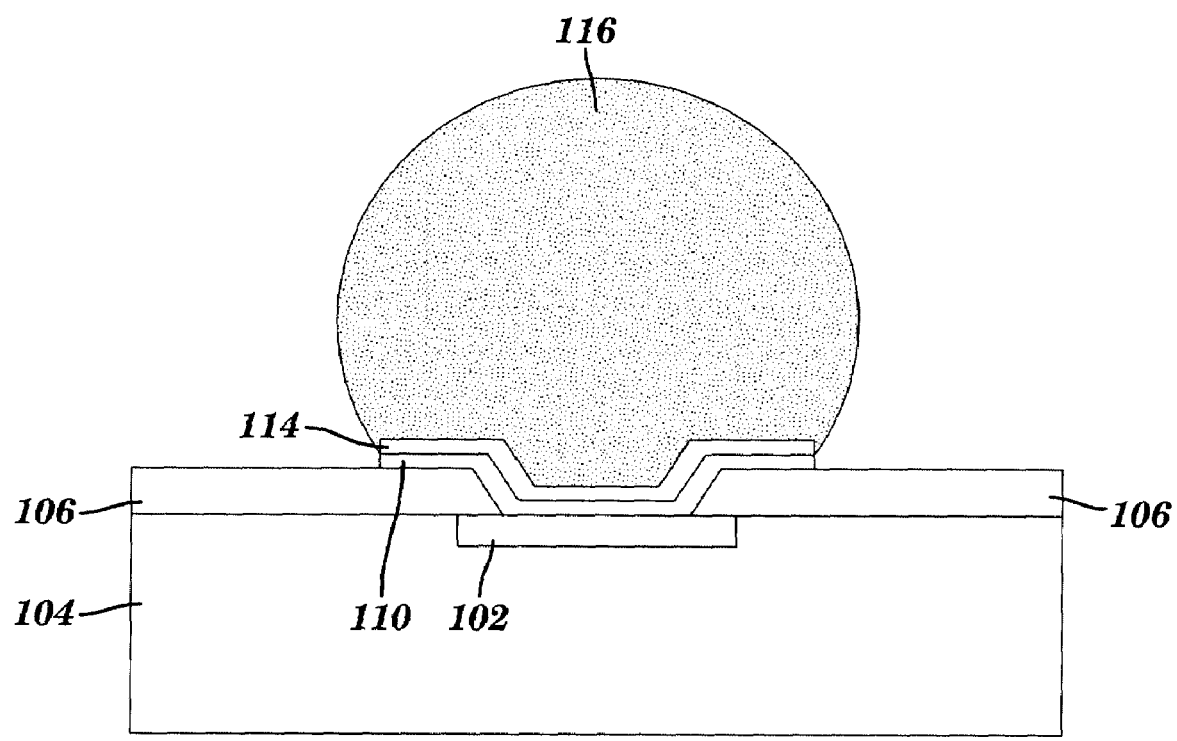
Figure 7A:
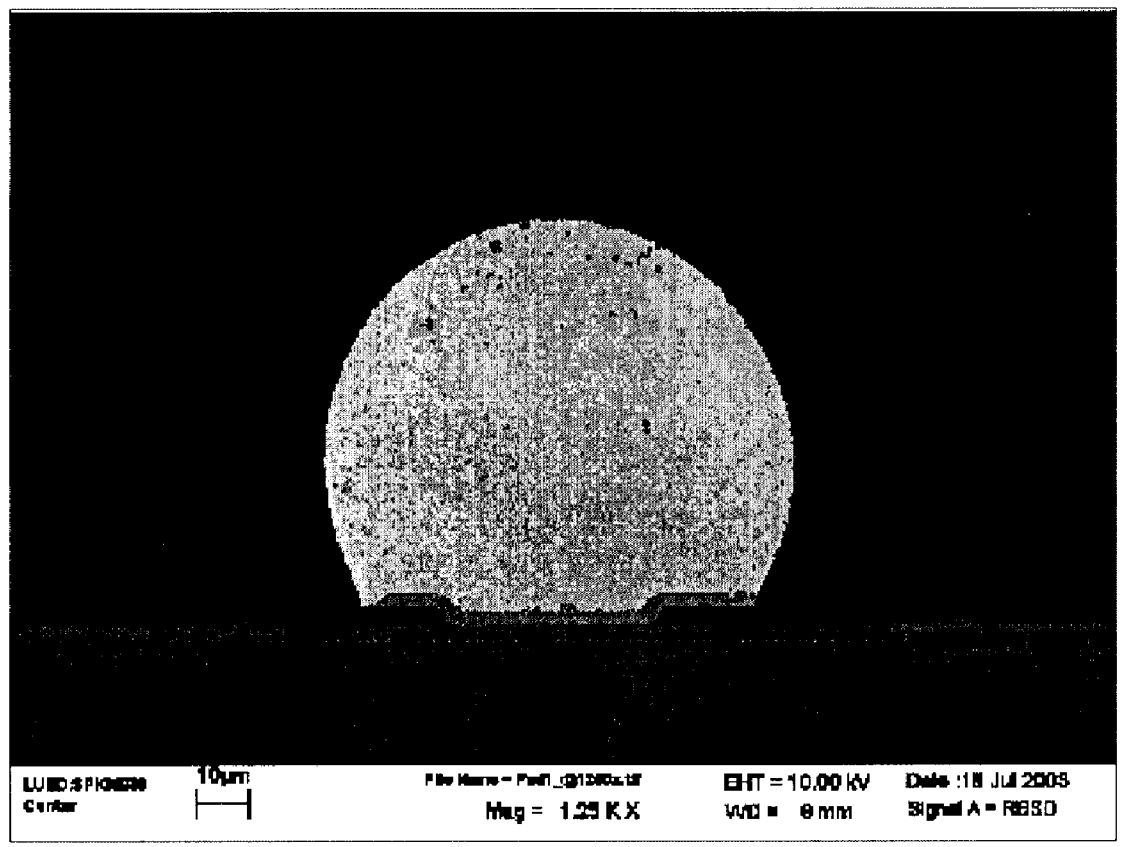
FIGS. 7(a) through 7(c) are SEM cross sections of a finished, reflowed C4 configured in accordance with the method illustrated in FIGS. 6(a) through 6(d)
Figure 7B:
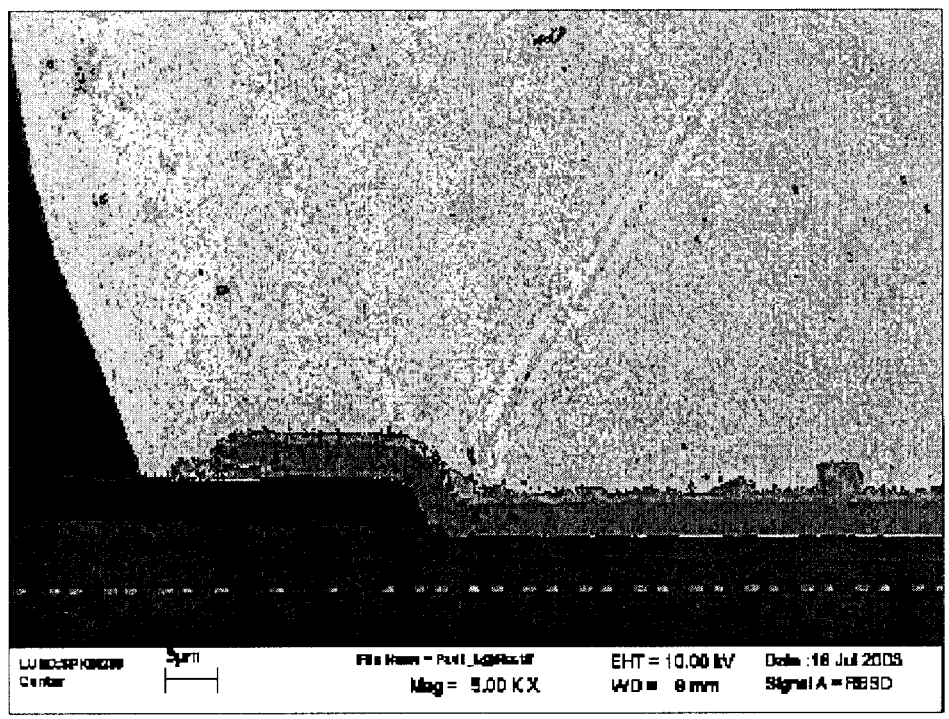
Figure 7C:
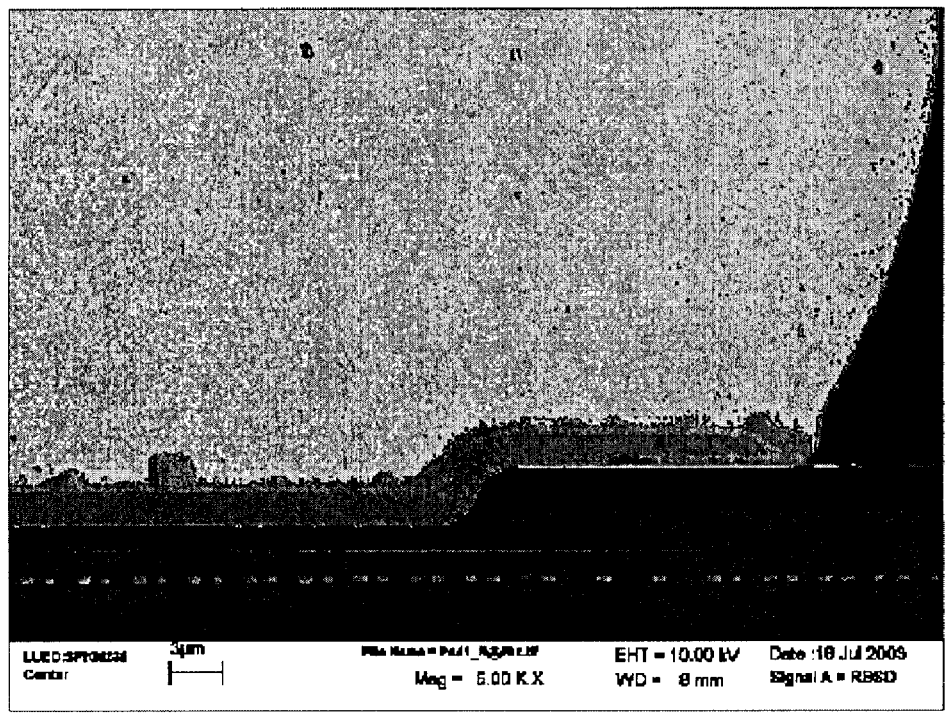

In FIG. 6(d), the second resist layer 118 is removed and the exposed portion of the seed layer 110 are etched to complete the BLM formation. However, in this instance, the underetching of the seed layer 110 is with respect to the wider edges of the solder material 116, instead of the barrier layer 114. Accordingly, during a reflow process, the solder material 116 retracts in a self-defined manner to the copper layer of the seed layer 116 as a result of the wettability property of a copper surface relative to (molten) solder material. As shown in FIG. 6(c), the reflow process thus insures a truncated, spherical-shaped solder ball with a structurally complete BLM TiW/CrCu/Cu stack corresponding to the dimensions of the barrier layer. Upon reflow, any thin copper atop the nickel/copper barrier layer, and pail of the nickel is consumed in the intermetallic formation process. FIGS. 7(a) through 7(c) are SEM cross sections of a finished, reflowed C4 configured in accordance with the method illustrated in FIGS. 6(a) through 6(d).

In another embodiment of the present invention, the underetch process is addressed by implementing an annealing approach so as to selectively alter the electrical resistivity and electrode potential of the Cu layer underneath the Ni barrier layer. Since a diffusion anneal (at optimized temperature and time conditions) results in Ni and Cu interdiffusion at the interface thereof, the diffusion of Ni into the Cu locally alters its resistivity and electrode potential. The extent of the Ni diffusion into the Cu (and thus the change in resistivity) may be controlled by adjusting the duration at which an annealing temperature is applied, in accordance with the laws of diffusion. Once resistivity and electrode potential of the Cu layer underneath the Ni barrier layer is altered with respect to the surrounding blanket Cu layer, the electroetch rate is slowed so as to create a self etch stop mechanism.

Ni—Cu interdiffusion has been studied for some time. The diffusion coefficient of Ni tracer in Cu $Ni^{63}$ Tracer Diffusion in Cu Data Between 698° C. and 1061° C.

Activation Energy Q=50.5 Kcal/mol
Frequency Factor $D_0$=0.78 cm$^2$/sec

The diffusion in thin films has been shown to be faster than that in bulk specimens, and thus the above numbers should only be used as general guidelines. However, order of magnitude calculations indicate that it is possible to achieve substantial diffusion of Ni to a distance of about one micron (a typical thickness of the blanket thin film in the BLM) at temperatures close to about 350–380° C., at times about 30 to 45 minutes. Moreover, the spatial extent of the diffusion is limited to a micron or so in the x, y and z directions. In particular, the electrical resistivity of Cu as a function of atomic % Ni is given in the table below:

Electrical Resistivity of Cu vs. Ni Content (Atomic %) at 300 K

| Atomic % of Ni | Resistivity ($\mu\Omega \cdot$ cm) |
| --- | --- |
| Pure Cu | 1.5–1.7 |
| Cu + 1.2 Ni | 3.0–3.5 |
| Cu + 2.16 Ni | 4.0–4.2 |
| Cu + 3.32 Ni | 5.8 |
| Cu + 10.00 Ni | ~15.00 |
| Cu + 25.00 Ni | ~32.00 |

As can be seen, there is a dramatic increase in the resistivity of Cu with Ni content in solid solution. At a Ni content of 10% atomic, the increase is roughly an order of magnitude.

Therefore, by selecting diffusion conditions such that the extent of Ni diffusion is about one micron in each direction in each direction, the resistivity of the Cu directly underneath the Ni barrier layer (and about a micron or two around the layer) should be increased by about an order of magnitude. This in turn defines a volume of Cu that will be electroetched at a much slower rate compared to the remaining portions of Cu without any diffused Ni. As will be appreciated by those skilled in the art, electroetching is a well-known metal etching process for back end of line (BEOL) wafer processing. An anodic voltage is applied to the wafer surface based on the electrolyte composition and the metal to be etched. The metal is preferably etched as anodic current flows through the wafer surface. With regard to electroetching of a BLM seed layer, the Cu and CrCu portions of the seed layers are removed simultaneously, while the Ni and solder metals are unaffected. Since diffused nickel into the copper seed layer would increase the electrical resistivity and passivity of the under bump seed layer, the degree of copper undercut is substantially reduced.

Figure 8A:
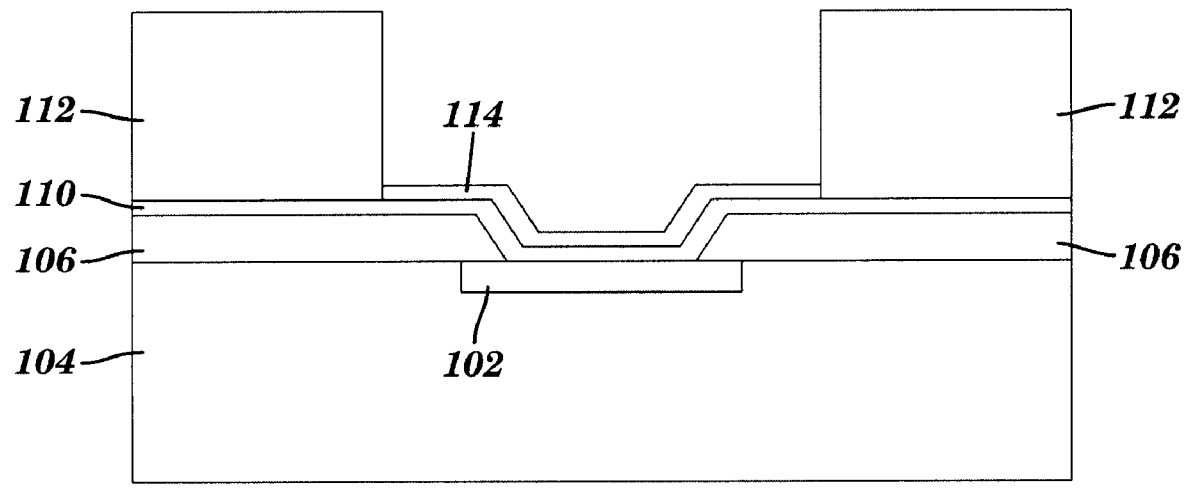
FIGS. 8(a) through 8(f) and FIGS. 9(a) through 9(c) illustrate another series of cross sectional views of an exemplary interconnect formation process using an annealing step, in accordance with a further embodiment of the invention.
Figure 8B:
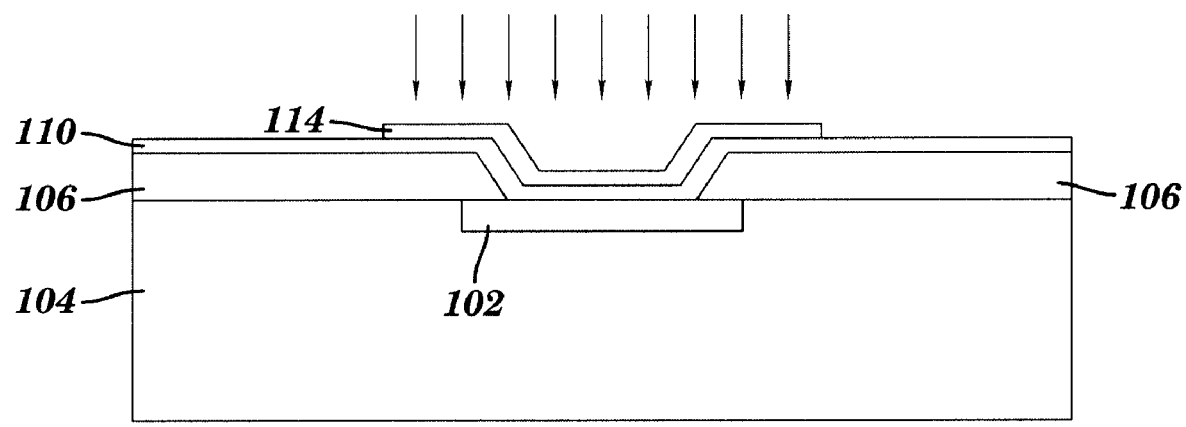

Referring now to FIGS. 8(a) through 8(f), there is shown another series of cross sectional views illustrating an exemplary interconnect formation process using an annealing step, in accordance with a further embodiment of the invention. In FIG. 8(a), a first pattern photoresist layer 112 is used to form the barrier layer 114 over the blanket seed layer 110 so as to ultimately define the dimensions of the BLM and C4 solder ball structures. In the case where the specific resist material used is incompatible with a thermal anneal, the first resist layer 112 is stripped prior to the diffusion anneal. The diffusion anneal is represented by the arrows shown in FIG. 8(b).

On the other hand, if the first lithography step is implemented in conjunction with a lithography coating that can withstand annealing temperatures (e.g., photoresist polymers, or non-polymeric material such as silicon oxide TEOS, etc.) and can be patterned by any technique (such as photo x-ray, laser, lithography and micromachining, for example), then the diffusion anneal could alternatively be carried out without first removing the developed resist. In that case, additional thin film deposition/electroplating steps may be carried out without the use of a second lithography step, thus leading to cost savings and improved yield losses from any misalignment in the second lithography step.

Figure 8C:
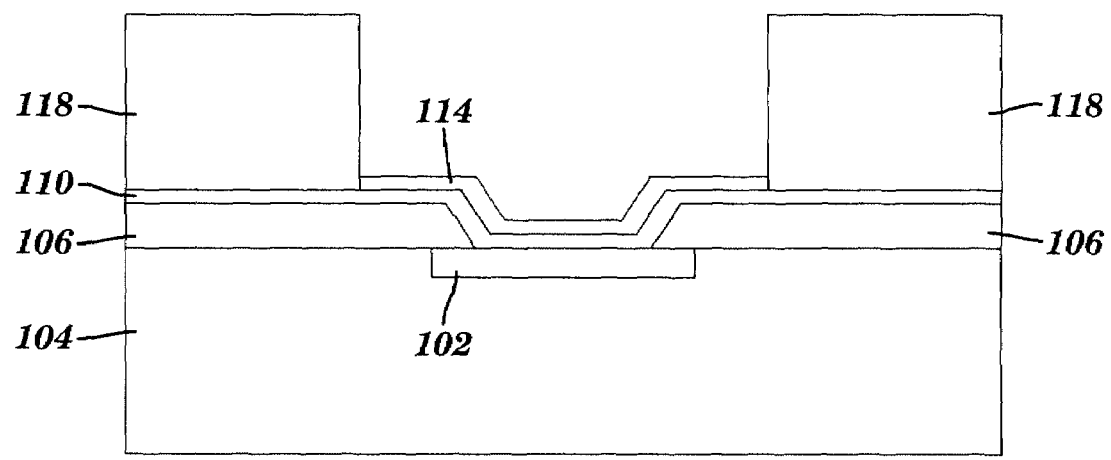
Figure 8D:
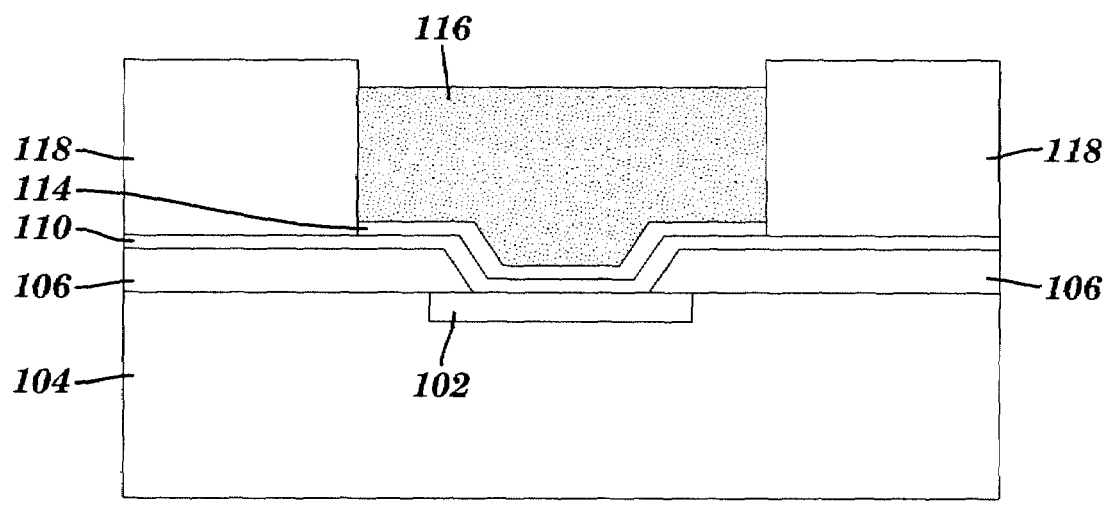
Figure 8E:
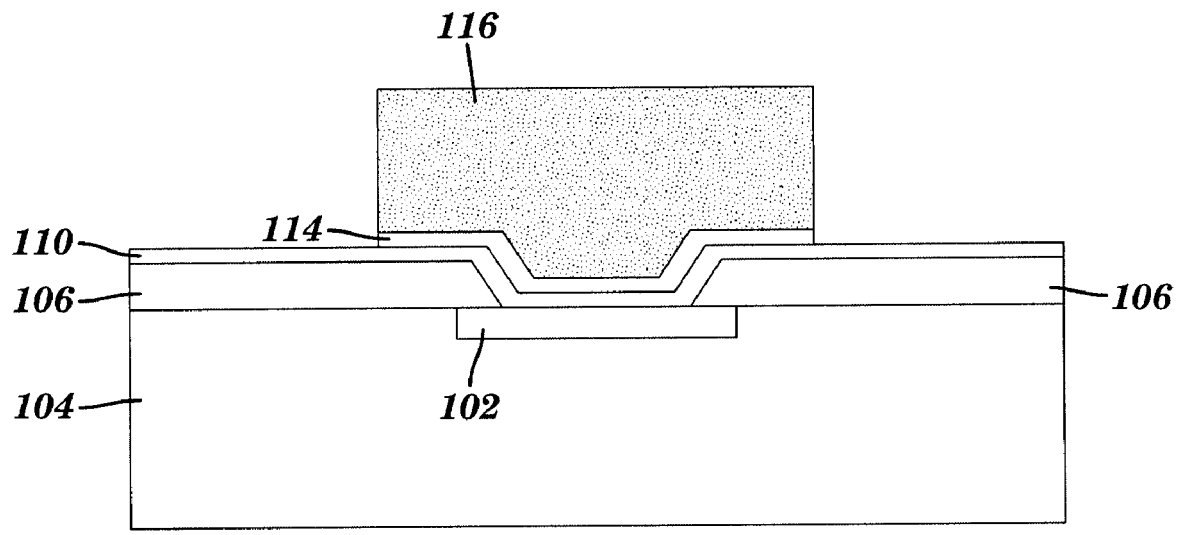

However, in the embodiment where the resist material is sensitive, FIG. 8(c) illustrates the patterning of the second photoresist layer 118. The second photoresist layer may be patterned with the same dimensions as the first photoresist layer 112 (as is shown), or may be intentional formed wider as described in the earlier embodiment. In FIG. 8(d), the solder material is deposited. At this point, the second resist layer is removed, as shown in FIG. 8(e), so that the remaining exposed portions of the seed layer 110 may be etched for final BLM definition.

Figure 8F:
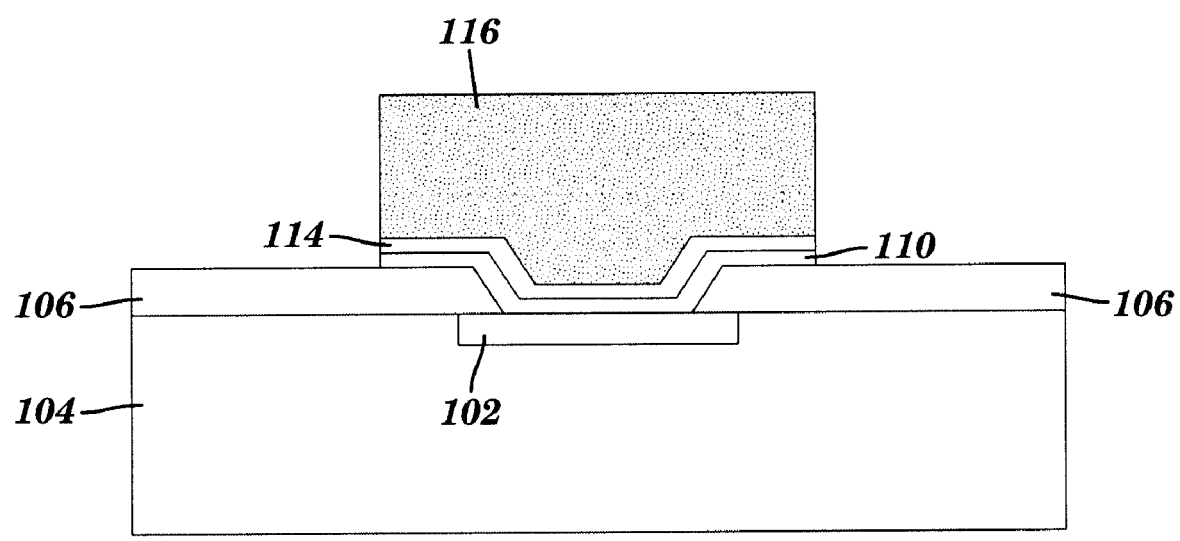

As a result of the altered resistivity and electrode potential of the copper layer portion of the seed layer 110 beneath the nickel/copper barrier layer 114, there is a created etch stop mechanism as described earlier. Thus, after electroetching of the Cu and CrCu portions of the seed layer 110, there is no underetching of the seed layer 110 with respect to the barrier layer 114, and the resulting BLM structure has improved structural integrity, as shown in FIG. 8(f).

Figure 9A:
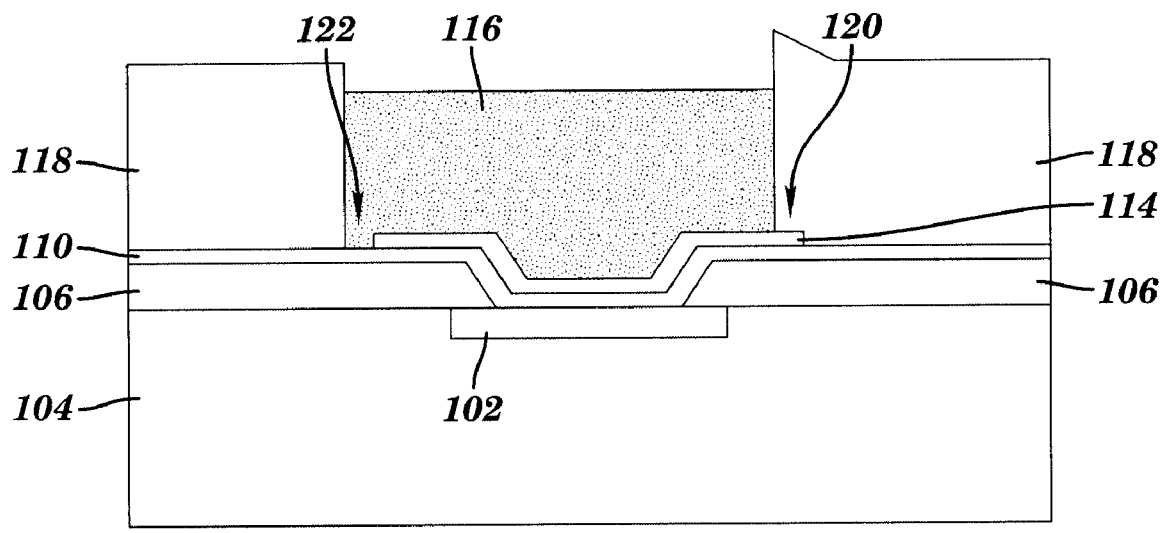
Figure 9B:
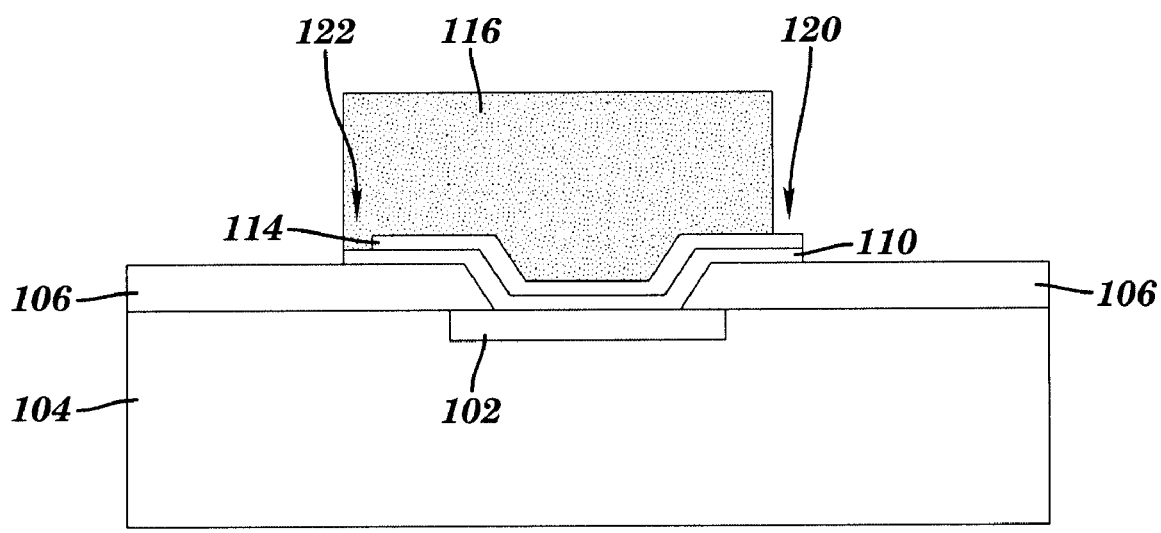
Figure 9C:
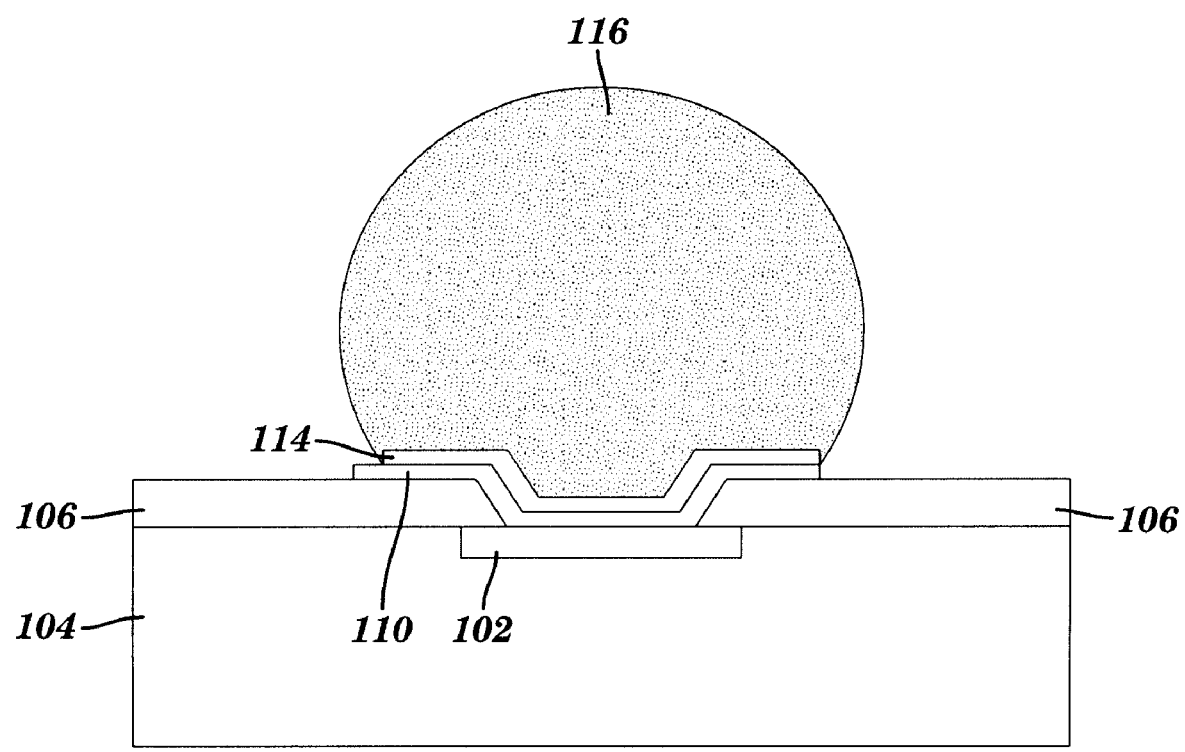

As also indicated earlier, the elimination of the undercut due to the Ni diffusion profile in the seed layer has an additional advantage in that the C4 solder ball will still align to the Ni barrier layer after reflow, even if a misalignment occurred during a second lithography patterning step. This additional advantage is illustrated in FIGS. 9(a) through 9(c). In FIG. 9(a), the second photoresist layer 118 is shown slightly misaligned such that a portion of the barrier layer 114 is covered on a first side 120, and a gap between the resist layer 118 and the barrier layer 114 is left on a second side 122. When the solder material 116 is deposited, some of the solder material 116 will be in direct contact with the exposed portion of the seed layer 110 on the second side 122.

After the second photoresist layer 118 is removed, as shown in FIG. 9(b), the exposed seed layer 110 is etched. Due to the earlier diffusion anneal, there is no undercutting of the copper in the seed layer 110. Thus, the layers of the BLM are generally in alignment at the first side 120, while there is an additional section of seed layer 110 underneath the barrier layer 114 at the second side 122, due to the misaligned deposited solder material 116. However, after a reflow of the solder material 116, the resulting C4 ball is self aligned to the nickel/copper barrier layer 114, as shown in FIG. 9(c). Moreover, the BLM is structurally complete, in that there are no portions of the seed layer 110 that undercut the dimensions of the barrier layer 114.

Although the diffusion anneal process is described with reference to C4 interconnect formation, it will be appreciated that its application is not limited to such, and can also be applied to other back end and front end metallization processes in which tighter ground rules application are of concern. For example, any interconnection wherein a solder material is placed on top of a barrier layer such as nickel/copper will result in self alignment to the barrier layer using this technique, thereby eliminating the need for a second, accurate photolithography exposure process.

As will also be appreciated, the above described technique of altering the resistivity of a layer through diffusion may also be adapted to create other general combinations of thin films, wherein a lithographically defined overlayer is annealed to result in a structure that features a self etch stop for etching processes, including an electroetching process.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for forming an interconnect structure for a semiconductor device, the method comprising:
   defining a via in passivation layer so as expose a top metal layer in the semiconductor device;
   forming a seed layer over said passivation layer, sidewalls of said via, and said top metal layer;
   forming a barrier layer over an exposed portion of said seed layer, said exposed portion defined by, a first patterned opening;
   annealing the semiconductor device so as to cause atoms from said barrier layer to diffuse into said seed layer thereunderneath; and
   following said annealing, forming a solder material over said barrier layer using a second patterned opening;
   wherein said annealing causes diffused regions of said seed layer to have an altered electrical resistivity and electrode potential with respect to undiffused regions of said seed layer, and wherein said second patterned opening is configured so as to have a lager diameter than said first patterned opening.

2. The method of claim 1, further comprising etching said seed layer, following said annealing, so as to define a ball limiting metallurgy (BLM), wherein remaining portions of said seed layer do not undercut said barrier layer.

3. The method of claim 1, further comprising:
   following said annealing, forming a solder material over said barrier layer using said first patterned opening.

4. The method of claim 3, wherein said first patterned opening is formed using a photoresist material that is capable of withstanding temperatures generated during said annealing.

5. A method for forming an interconnect structure for a semiconductor device the method comprising:
   defining a via in a passivation layer so as expose a top metal layer in the semiconductor device;
   forming a seed layer over said passivation layer sidewalls of said via, and said top metal layer;
   forming a barrier layer over an exposed portion of said seed layer, said exposed portion defined by a first patterned opening, and
   annealing the semiconductor device so as to cause atoms from said barrier layer to diffuse into said seed layer thereunderneath;
   wherein said annealing causes diffused regions of said seed layer to have an altered electrical resistivity and electrode potential with respect to undiffused regions of said seed layer, and wherein said annealing is implemented at a temperature and a duration so as to cause atoms from said barrier layer to diffuse into said seed layer by about one micron in x, y and z-directions.

6. The method of claim 5, wherein said annealing results in an increased electrical resistivity of said diffused regions of said seed layer by about one order of magnitude.

7. The method of claim 5, wherein:
   said seed layer comprises a titanium-tungsten/chrome-copper/copper (TiW/CrCu/Cu) layer; and
   said barrier layer comprises a nickel/copper layer.

8. The method of claim 7, wherein copper and chrome copper portions of seed layer are removed by electroetching.

9. The method of claim 7, wherein said annealing is implemented at temperature of about 350 to about 380° C. for a duration of about 30 to about 45 minutes.

10. A method for introducing a self etch stop mechanism within a metallic thin film, the method comprising:
    forming overlayer upon the thin film;
    annealing the thin film so as to cause atoms from said overlayer to diffuse into the thin film thereunderneath;
    wherein said annealing causes diffused regions of the thin film to have an altered electrical resistivity and electrode potential with respect to undiffused regions of the thin film and wherein said annealing is implemented at a temperature and a duration so as to cause atoms from said overlayer to diffuse into the thin film by about one micron in x, y and z-directions.

11. The method of claim 10, wherein said annealing results in an altered electrical resistivity and electrode potential of said diffused regions of the thin film by about one order of magnitude.

12. The method of claim 10, wherein:
    the thin film includes a copper layer; and
    said over-layer includes a nickel/copper layer.

* * * * *

UNITED STATES PATENT AND TRADEMARK OFFICE
CERTIFICATE OF CORRECTION

PATENT NO. : 6,995,084 B2  Page 1 of 1
APPLICATION NO. : 10/708649
DATED : February 7, 2006
INVENTOR(S) : Kamalesh K. Srivastava et al.

It is certified that error appears in the above-identified patent and that said Letters Patent is hereby corrected as shown below:

Title Page, Item (75) Inventors:

Please correct the inventorship as follows: Kamalesh K. Srivastava, Subhash L. Shinde, Tien-Jen Cheng, Sarah H. Knickerbocker, William E. Sablinski The following inventors should be removed from the patent: Roger A. Quon, Julie C. Biggs, David E. Eichstadt and Jonathan H. Griffith.

Signed and Sealed this

Twenty-sixth Day of January, 2010

David J. Kappos
*Director of the United States Patent and Trademark Office*